US010440481B2

(12) United States Patent
Kasai et al.

(10) Patent No.: US 10,440,481 B2
(45) Date of Patent: Oct. 8, 2019

(54) CAPACITIVE TRANSDUCER AND ACOUSTIC SENSOR

(71) Applicant: OMRON Corporation, Kyoto (JP)

(72) Inventors: Takashi Kasai, Kusatsu (JP); Koji Momotani, Moriyama (JP); Mariko Terasaka, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/753,521

(22) PCT Filed: Jan. 31, 2017

(86) PCT No.: PCT/JP2017/003354
§ 371 (c)(1),
(2) Date: Feb. 19, 2018

(87) PCT Pub. No.: WO2017/154414
PCT Pub. Date: Sep. 14, 2017

(65) Prior Publication Data
US 2018/0249257 A1 Aug. 30, 2018

(30) Foreign Application Priority Data
Mar. 10, 2016 (JP) ................................. 2016-047305

(51) Int. Cl.
H04R 19/04 (2006.01)
B81B 3/00 (2006.01)
(Continued)

(52) U.S. Cl.
CPC ............... H04R 19/04 (2013.01); B81B 3/00 (2013.01); B81B 3/001 (2013.01); B81B 3/0002 (2013.01);
(Continued)

(58) Field of Classification Search
CPC .... H04R 19/04; H04R 19/005; B81B 3/0002; B81B 3/001; B81B 3/0035; B81B 3/0056; B81B 3/0078; H01L 29/84
(Continued)

(56) References Cited

U.S. PATENT DOCUMENTS 8,737,171 B2  5/2014 Jenkins et al.
8,816,454 B2 * 8/2014 Zoellin ................ B81B 3/0021
                                                    257/416
(Continued)

FOREIGN PATENT DOCUMENTS

CN  104469578 A  3/2015
CN  104541521 A  4/2015
(Continued)

OTHER PUBLICATIONS

International Search Report of the International Searching Authority issued in PCT/JP2017/003354 dated Apr. 4, 2017 (2 pages).
(Continued)

Primary Examiner — Jesse A Elbin
(74) Attorney, Agent, or Firm — Osha Liang LLP

(57) ABSTRACT

A capacitive transducer includes a substrate having an opening in a surface thereof, a back plate facing the opening in the substrate, a vibration electrode film facing the back plate across a space, the vibration electrode film being deformable to have a deformation converted into a change in capacitance between the vibration electrode film and the back plate, the vibration electrode film having a through-hole as a pressure relief hole, and a protrusion integral with and formed from the same member as the back plate, the protrusion being placeable in the pressure relief hole before the vibration electrode film deforms. The protrusion and the pressure relief hole have a gap therebetween defining an airflow channel as a pressure relief channel.

24 Claims, 20 Drawing Sheets

(51) Int. Cl.
*H01L 29/84* (2006.01)
*H04R 19/00* (2006.01)

(52) U.S. Cl.
CPC ............ *B81B 3/0056* (2013.01); *H01L 29/84* (2013.01); *H04R 19/005* (2013.01)

(58) Field of Classification Search
USPC .................. 381/175; 257/254, 416, 419
See application file for complete search history.

(56) References Cited

U.S. PATENT DOCUMENTS

| | | |
|---|---|---|
| 2013/0069179 A1 | 3/2013 | Ishimoto et al. |
| 2014/0353780 A1 | 12/2014 | Perletti et al. |
| 2015/0078592 A1 | 3/2015 | Uchida |
| 2015/0078593 A1 | 3/2015 | Uchida |
| 2016/0212542 A1 | 7/2016 | Wang |
| 2017/0289702 A1* | 10/2017 | Inoue .................... H04R 19/04 |

FOREIGN PATENT DOCUMENTS

| | | |
|---|---|---|
| CN | 105009604 A | 10/2015 |
| EP | 2866469 A2 | 4/2015 |
| JP | 2008-259061 A | 10/2008 |
| JP | 2011-250170 A | 12/2011 |
| JP | 2015-56832 A | 3/2015 |
| JP | 2015-56833 A | 3/2015 |
| WO | 2014/045040 A1 | 3/2014 |

OTHER PUBLICATIONS

Written Opinion of the International Searching Authority issued in PCT/JP2017/003354 dated Apr. 4, 2017 (3 pages).

Extended European Search Report issued in European Application No. 17762760.1, dated Jan. 29, 2019 (7 pages).

Office Action issued in Chinese Application No. 201780002680.2, dated Aug. 20, 2019 (6 pages).

* cited by examiner

CAPACITIVE TRANSDUCER AND ACOUSTIC SENSOR

BACKGROUND

Field

The disclosure relates to a capacitive transducer and an acoustic sensor including the capacitive transducer. The present invention particularly relates to a capacitive transducer with a capacitor structure including a vibration electrode film with the MEMS technology and a back plate, and to an acoustic sensor including the capacitive transducer.

Related Art

Small microphones known in the art may incorporate acoustic sensors called electret condenser microphones (ECMs). However, ECMs are susceptive to heat and are less suited to digitization and miniaturization than microphones incorporating capacitive transducers fabricated using the micro electro mechanical systems (MEMS) technology (hereafter, MEMS microphones). Thus, MEMS microphones have been increasingly used (refer to, for example, Patent Literature 1).

A capacitive transducer fabricated using the MEMS technology may include a vibration electrode film that vibrates under pressure and a back plate to which an electrode film is fixed. The vibration electrode film and the back plate are arranged to face each other across a space. The capacitive transducer with this structure may be achieved by, for example, forming a vibration electrode film on a silicon substrate, a sacrificial layer over the vibration electrode film, and a back plate on the sacrificial layer, and then removing the sacrificial layer. The MEMS technology, which is based on the semiconductor fabrication technology, enables fabrication of very small capacitive transducers.

However, capacitive transducers fabricated using the MEMS technology include a thin vibration electrode film and a thin back plate. The thin vibration electrode film may deform greatly and break under an excessively high pressure. The capacitive transducer may have this disadvantage when, for example, receiving an air blow in its mounting process or when the capacitive transducer falls, in addition to when receiving a large sound pressure.

In response to this, the vibration electrode film may have a pressure relief hole to relieve any excessively high pressure through the hole. However, this may degrade the frequency characteristics of the capacitive transducer, or may reduce the sensitivity within a low-frequency sound range.

Another technique is a MEMS transducer including a vibration electrode film and a plug portion separated from the vibration electrode film by slits. The plug portion is held by a support on a back plate or a substrate at the same level as the other part of the vibration electrode film. The vibration electrode film in this disclosure moves in accordance with the pressure difference across the film to enlarge the flow channel between the film and the plug portion, thus relieving an excessively high pressure (refer to, for example, Patent Literature 2).

Another known acoustic sensor converts an acoustic vibration into a change in the capacitance between a vibration electrode film and a fixed electrode film on a back plate and detects the acoustic vibration. This acoustic sensor includes a protrusion integral with the back plate, which is placed in a pressure relief hole in the vibration electrode film before the vibration electrode film deforms. When the vibration electrode film deforms away from the back plate under an excessively high pressure, the protrusion withdrawn from the pressure relief hole increases the area of air passage to relieve the pressure applied to the vibration electrode film.

When the vibration electrode film deforms away from the back plate under an excessively high pressure, this technique enables the protrusion to be withdrawn from the pressure relief hole to increase the area of the airflow channel. The protrusion integral with the back plate may typically be either columnar or tapered to have its diameter decreasing from the back plate.

When pressure is applied toward the back plate from the vibration electrode film in the acoustic sensor, the vibration electrode film moves toward the back plate. This causes the area of air passage to either remain constant or decrease, causing difficulties in relieving the pressure.

Patent Literature 1: Japanese Unexamined Patent Application Publication No. 2011-250170
Patent Literature 2: U.S. Pat. No. 8,737,171

SUMMARY

One or more aspects of the present invention are directed to a technique for reducing excessive deformation of a vibration electrode film deforming in any direction under an excessively high pressure applied to an acoustic sensor and preventing the vibration electrode film from breaking.

One aspect of the present invention provides a capacitive transducer including a substrate having an opening in a surface thereof, a back plate facing the opening in the substrate, a vibration electrode film facing the back plate across a space, and a protrusion integral with and formed from the same member as the back plate. The vibration electrode film is deformable to have a deformation converted into a change in capacitance between the vibration electrode film and the back plate. The vibration electrode film has a through-hole as a pressure relief hole. The protrusion is placed in the pressure relief hole before the vibration electrode film deforms. The protrusion and the pressure relief hole have a gap therebetween defining an airflow channel as a pressure relief channel. The protrusion includes, at a predetermined position adjacent to the back plate, a smaller cross-section portion having a smaller cross-sectional area in a direction parallel to the back plate than a portion of the protrusion more distal from the predetermined position.

In this structure, the vibration electrode film may deform greatly toward the back plate under an excessively high pressure applied to the vibration electrode film from its side opposite to the back plate. In this state, the smaller cross-section portion of the protrusion at the predetermined position passes through the pressure relief hole to increase the area of air passage for pressure relief, thus preventing the vibration electrode film from deforming excessively.

The vibration electrode film may deform away from the back plate greatly under an excessively high pressure applied from across the back plate. In this state, the more distal, larger cross-section portion of the protrusion passes through the pressure relief hole. This structure first reduces the area of air passage for pressure relief, but then increases the area of air passage sufficiently for pressure relief at the position where the protrusion protrudes out of the pressure relief hole in the vibration electrode film. The structure according to the aspect of the present invention prevents the vibration electrode film from deforming excessively under an excessively high pressure applied either from across the back plate or from the opposite side.

In the above aspect, the protrusion may be tapered to have a cross-sectional area decreasing toward the back plate. This increases the area of air passage continuously in accordance with a deformation of the vibration electrode film toward the back plate. This structure more readily prevents the vibration electrode film from deforming excessively toward the back plate under an excessively high pressure applied from its side opposite to the back plate.

In the above aspect, the protrusion may have a cavity extending through a surface thereof opposite to the back plate and a side surface thereof at the predetermined position. This allows the smaller cross-section portion to be formed in a process of forming sound holes after the protrusion is formed on the back plate.

In the above aspect, the protrusion may be flat and have a side surface perpendicular to the back plate. The protrusion is thicker in the vertical direction than the other portion of the back plate. The protrusion can have a hole formed similarly in the process of forming sound holes in the other portion of the back plate. This automatically leaves a more distal portion of the protrusion unetched to have a large cross-section. This etching with higher vertical directivity, such as dry etching, can be used to form a smaller cross-section portion in a more reliable manner in the sound hole forming process.

In the above aspect, at least one of the back plate and the vibration electrode film may include a stopper that comes into contact with another of the back plate and the vibration electrode film when the vibration electrode film is displaced toward the back plate, and the cavity in the protrusion may have a depth perpendicular to the back plate being greater than a total of a height of the stopper and a thickness of the vibration electrode film.

Under an excessively high pressure applied from the side opposite to the back plate, the vibration electrode film deforms toward the back plate, causing the stopper on one of the back plate and the vibration electrode film to come in contact with the other of the back plate and the vibration electrode film. In this state, the cavity in the protrusion forms through the vibration electrode film and is open on its side opposite to the back plate in a more reliable manner. The vibration electrode film in contact with the stopper allows passage of air on the side opposite to the back plate to escape through the cavity in a more reliable manner. This enables more reliable relief of pressure.

In the above aspect, the cavity may be circular as viewed in a direction perpendicular to the back plate. This structure most effectively prevents stress concentration on the back plate and around the cavity in the protrusion, and relatively increases the strength of the protrusion on the back plate.

Another aspect of the present invention provides an acoustic sensor including the above capacitive transducer. The acoustic sensor converts a sound pressure into a change in capacitance between the vibration electrode film and the back plate, and detects the sound pressure. This acoustic sensor can maintain good frequency characteristics during sound detection, and prevents the vibration electrode film from deforming excessively in any direction in which an excessively high pressure is applied and thus from breaking. The acoustic sensor according to this aspect thus has good frequency characteristics and high reliability.

The aspects may be combined as appropriate.

The capacitive transducer according to one or more of the above aspects can maintain good frequency characteristics during pressure detection, and prevents the vibration electrode film from deforming excessively in any direction under an excessively high pressure applied to the acoustic sensor and thus from breaking. The capacitive transducer can maintain better performance and have higher reliability.

DETAILED DESCRIPTION

First Embodiment

Embodiments of the present invention will now be described with reference to the drawings. The embodiments described below are mere examples of this invention and should not be construed as limiting the technical scope of the invention. Although the present invention is applicable to any electrostatic transducer, an electrostatic transducer used as an acoustic sensor will be described. However, a voice transducer according to the embodiments of the present invention may be used as any non-acoustic sensor for detecting the displacement of a vibration electrode film. For example, the transducer may be used as a pressure sensor, an acceleration sensor, or an inertial sensor. In addition, the transducer may be used as a non-sensor device such as a speaker for converting an electrical signal into a displacement. The components including a back plate, a vibration electrode film, a back chamber, and a substrate may be in any arrangement that provides the same functions as produced by the components arranged in the arrangement described below. For example, the back plate and the vibration electrode film may be reversed.

Figure 1:
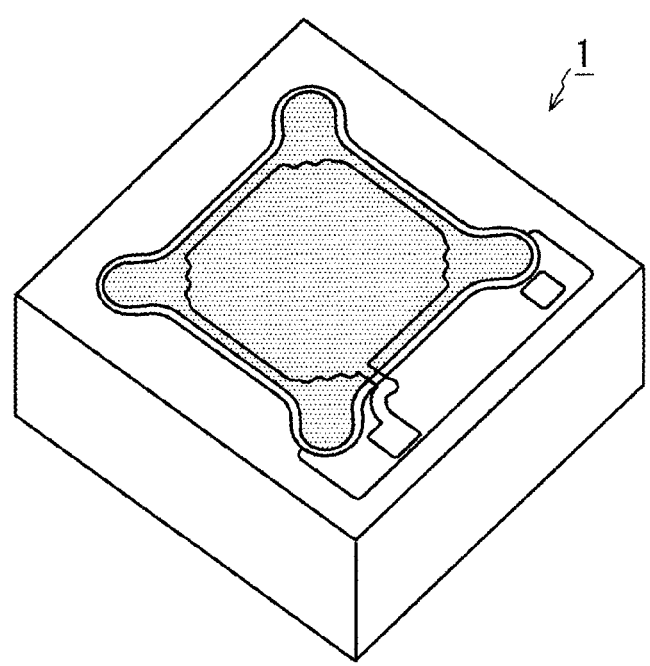
FIG. 1 is a perspective view of a known acoustic sensor fabricated using the MEMS technology.
Figure 2:
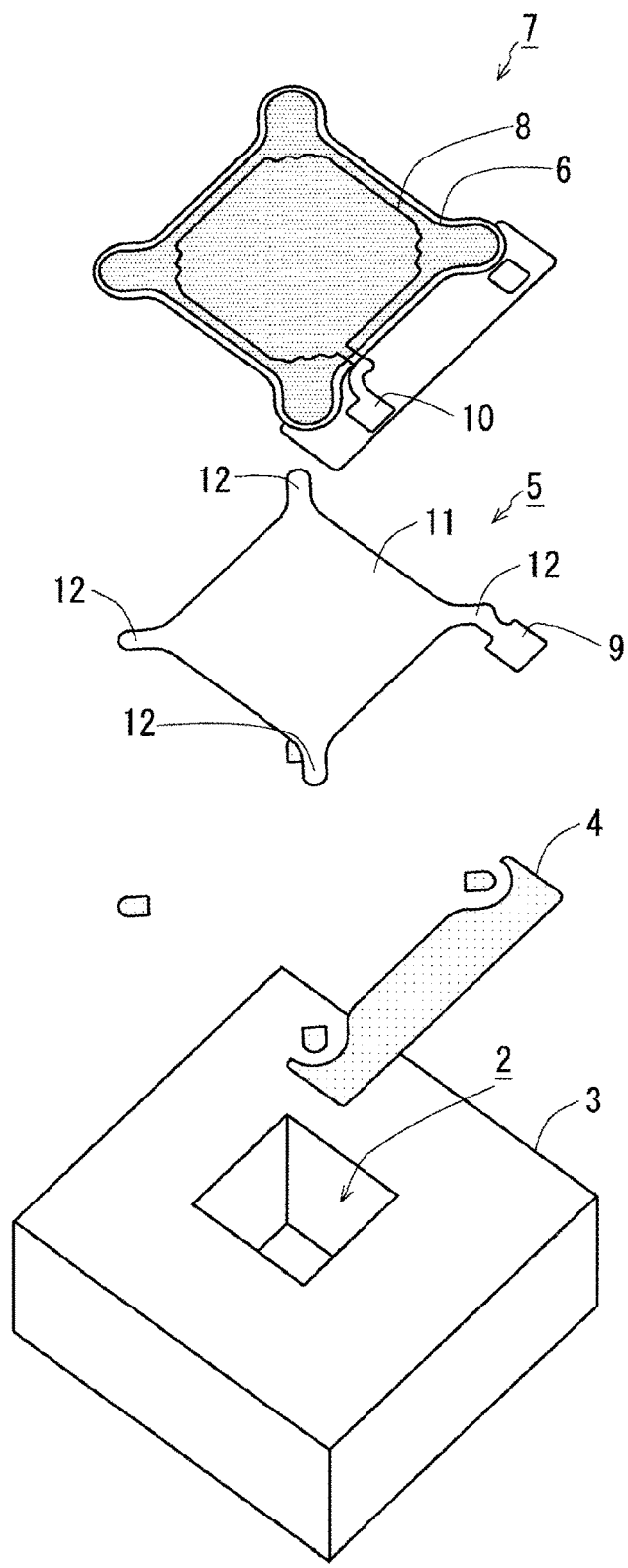
FIG. 2 is an exploded perspective view of the known acoustic sensor showing its internal structure.

FIG. 1 is a perspective view of a known acoustic sensor 1 fabricated using the micro electro mechanical system (MEMS) technology. FIG. 2 is an exploded perspective view of the acoustic sensor 1 showing its internal structure. The acoustic sensor 1 is a laminate of a silicon substrate (substrate) 3 having a back chamber 2, and a dielectric film 4, a vibration electrode film (diaphragm) 5, and a back plate 7 placed on the top surface of the silicon substrate 3. The back plate 7 includes a fixed plate 6 and a fixed electrode film 8 on the fixed plate 6 and adjacent to the silicon substrate 3. The fixed plate 6 in the back plate 7 has multiple sound holes or openings across it (the individual sound holes are indicated by the dots in the shaded area of the fixed plate 6 shown in FIGS. 1 and 2). The fixed electrode film 8 has a fixed electrode pad 10 for obtaining an output signal arranged at one of its four corners.

The silicon substrate 3 may be formed from, for example, single-crystal silicon. The vibration electrode film 5 may be formed from, for example, conductive polycrystalline silicon. The vibration electrode film 5 is thin and substantially rectangular, and has fixation parts 12 at the four corners of a substantially quadrilateral vibration part 11. The vibration electrode film 5 is located on the top surface of the silicon substrate 3 to cover the back chamber 2, and is fixed to the silicon substrate 3 at the four fixation parts 12 serving as anchor portions. The vibration part 11 of the vibration electrode film 5 vibrates vertically in response to sound pressure.

The vibration electrode film 5 is not in contact with the silicon substrate 3 nor with the back plate 7 except at its four fixation parts 12. The vibration electrode film 5 can thus vertically vibrate more smoothly in response to sound pressure. The vibration part 11 has a vibration film electrode pad 9 at one of the fixation parts 12 at the four corners. The fixed electrode film 8 on the back plate 7 corresponds to the vibration area of the vibration electrode film 5, which is the area excluding the fixation parts 12 at the four corners. The fixation parts 12 of the vibration electrode film 5 at the four corners do not vibrate in response to sound pressure and thus the capacitance remains unchanged between the vibration electrode film 5 and the fixed electrode film 8.

When the acoustic sensor 1 receives sound, the sound passes through the sound holes and applies sound pressure to the vibration electrode film 5. More specifically, the sound holes allow the sound pressure to be applied to the vibration electrode film 5. The sound holes also reduce thermal noise and thus reduce noise by allowing easy escape of air from the air gap between the back plate 7 and the vibration electrode film 5.

When the acoustic sensor 1 with the structure described above receives sound, the vibration electrode film 5 vibrates to change the distance between the vibration electrode film 5 and the fixed electrode film 8. In response to the change in the distance between the vibration electrode film 5 and the fixed electrode film 8, the capacitance between the vibration electrode film 5 and the fixed electrode film 8 changes. The sound pressure can be detected as an electrical signal by applying a direct current (DC) voltage across the vibration film electrode pad 9 electrically connected to the vibration electrode film 5 and the fixed electrode pad 10 electrically connected to the fixed electrode film 8, and converting the resulting change in the capacitance into an electrical signal.

Figure 3:
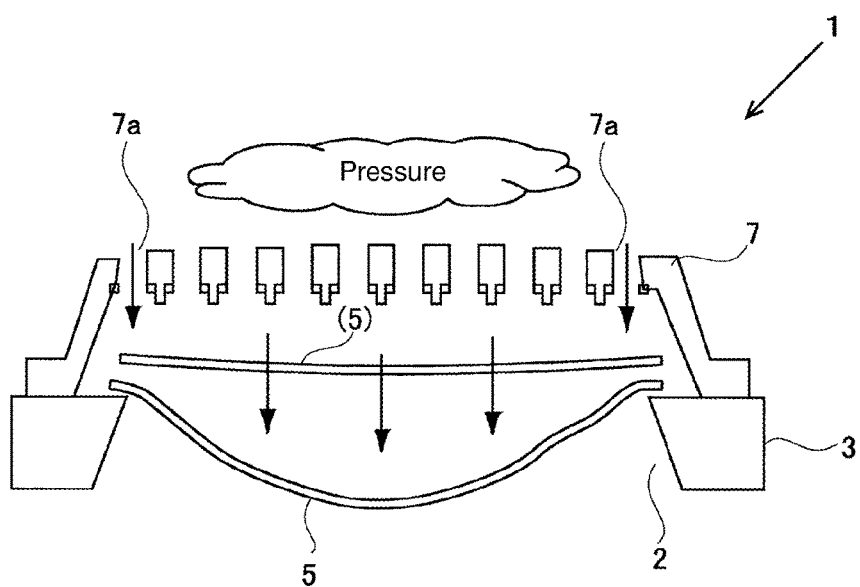
FIG. 3 is a diagram describing an acoustic sensor to which an excessively high pressure is abruptly applied.

The above acoustic sensor 1 known in the art may have the disadvantage described below. FIG. 3 is a schematic diagram showing the acoustic sensor 1 under an excessively high pressure. As shown in FIG. 3, when the acoustic sensor 1 receives an excessively high pressure, the large pressure may be applied to the vibration part 11 of the vibration electrode film 5 through sound holes 7a formed in the back plate 7. The large pressure may severely distort the vibration part 11 and break the vibration electrode film 5. This disadvantage may occur when, for example, the acoustic sensor 1 receives an excessive air pressure or when the acoustic sensor 1 falls.

Figure 4A:
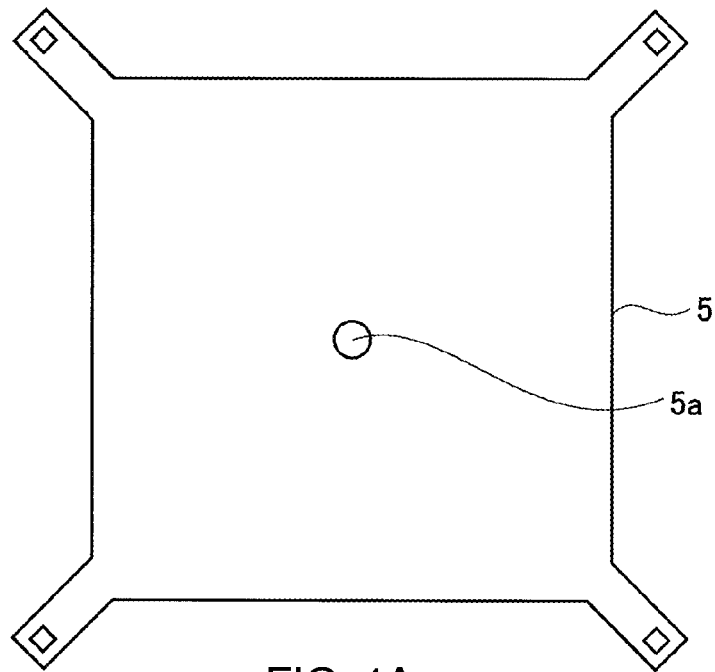
FIGS. 4A and 4B are diagrams describing a known response to an excessively high pressure abruptly applied to the acoustic sensor.
Figure 4B:
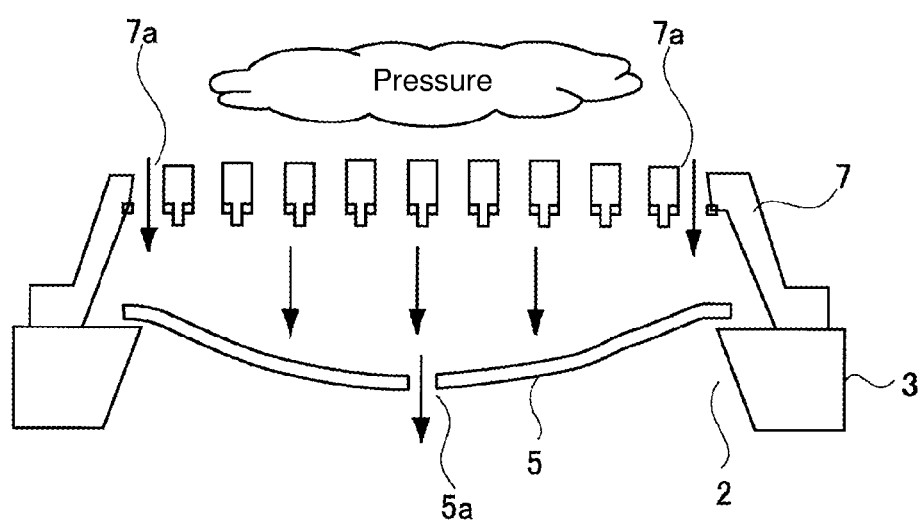

FIGS. 4A and 4B show a possible response to this. As shown in FIG. 4A, a hole 5a for relieving an applied pressure is formed in the vibration electrode film 5. As shown in FIG. 4B, an excessively high pressure applied through the sound holes 7a formed in the back plate 7 of the acoustic sensor 1 may be relieved through the hole 5a. This prevents the vibration electrode film 5 from breaking. However, although the hole 5a, which is normally open, formed in the vibration electrode film 5 improves the durability against pressure, the hole may reduce sensitivity, or may cause roll-off, particularly within a low-frequency sound range, and may degrade the frequency characteristics of the acoustic sensor 1.

Another response may be a vibration electrode film, and a plug portion separated from the vibration electrode film by slits included as a pressure relief measure. The plug portion may be held by a support on a back plate at the same level as the other part of the vibration electrode film. This vibration electrode film moves in accordance with the pressure difference across the film to enlarge the flow channel between the film and the plug portion, and the enlarged channel allows an excessively high pressure to be relieved (refer to, for example, Patent Literature 2).

However, this response has disadvantages described below. For example, the plug portion is fragile because it is a part of the very thin vibration electrode film. The lid-like plug portion is supported on the back plate using the support that is a separate rod member. This complicates the manufacturing processes, and may cause the plug portion to come off the support.

Further, this vibration electrode film moves in accordance with the pressure difference across the film to enlarge the flow channel between the vibration electrode film and the plug portion, which is separated from the vibration electrode film by the slits. The enlarged channel then allows an excessively high pressure to be relieved. More specifically, the flow channel corresponds to the gap between the thin films, which are the vibration electrode film and the plug portion separated from the vibration electrode film by the slits. Thus, when the amplitude of the vibration electrode film increases under a relatively large pressure, which is within an operable pressure range, the plug portion and the vibration electrode film may deviate from each other beyond their film thickness. The resulting larger flow channel may cause unstable frequency characteristics of the acoustic sensor 1.

Another response to the above disadvantage is a vibration electrode film having holes for relieving an applied pressure. Before the vibration electrode film deforms, a column integral with and protruding from a back plate passes through and partially blocks the hole. When the vibration electrode film deforms under pressure, the relative movement between the vibration electrode film and the back plate withdraws the back plate column from the hole to uncover the entire hole, through which the pressure applied to the vibration electrode film is relieved.

Figure 5A:
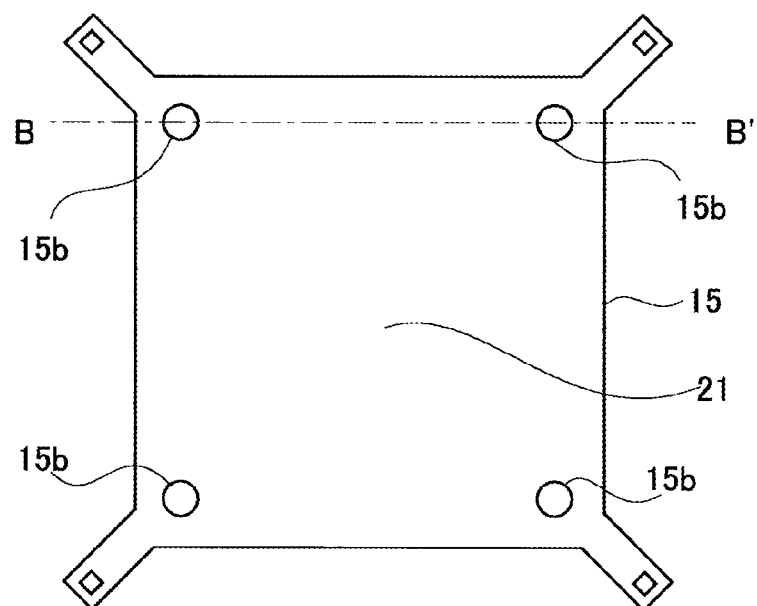
FIGS. 5A and 5B are diagrams describing another known response to an excessively high pressure abruptly applied to the acoustic sensor.
Figure 5B:
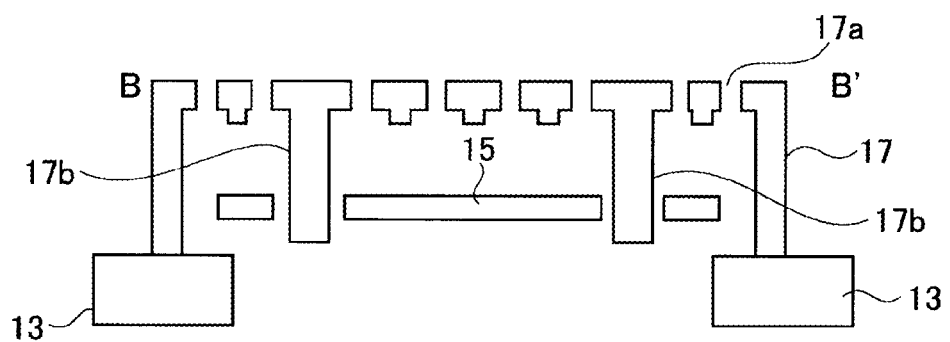

FIGS. 5A and 5B are schematic views of an acoustic sensor showing a part a vibration electrode film 15 and a back plate 17 in the above structure. FIG. 5A is a plan view of the vibration electrode film 15. FIG. 5B is a cross-sectional view taken along line B-B', showing the vibration electrode film 15, the back plate 17, and a substrate 13. As shown in FIG. 5A, pressure relief holes 15b are opened at the four corners of a vibration part 21 of the vibration electrode film 15 in this structure. As shown in FIG. 5B, a columnar protrusion 17b integral with the back plate 17 passes through and blocks the pressure relief hole 15b before the vibration electrode film 15 receives an excessively high pressure. The protrusion 17b is a part of the back plate 17 that is formed when the back plate 17 is prepared through semiconductor manufacturing processes.

Figure 6A:
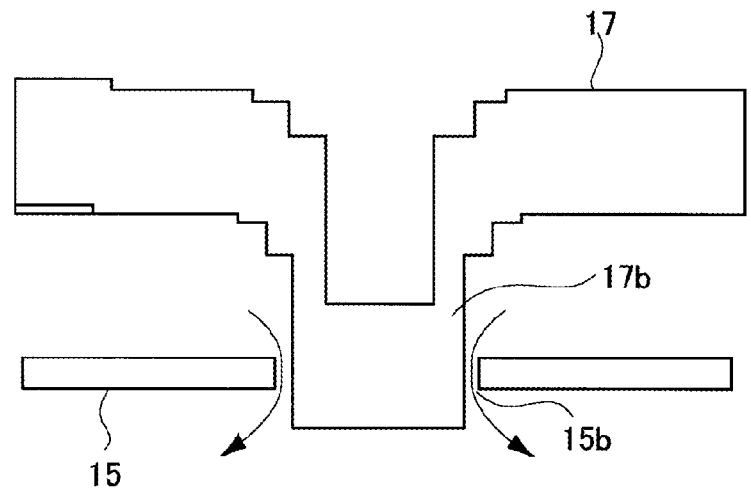
FIGS. 6A and 6B are diagrams describing the functions of a pressure relief hole and a protrusion in the known response to an excessively high pressure abruptly applied to the acoustic sensor.
Figure 6B:
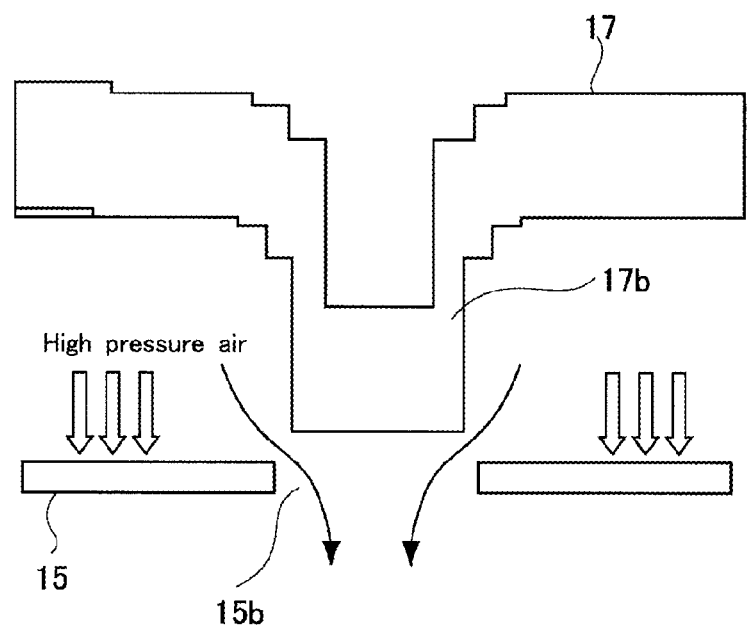

The functions of the pressure relief holes 15b and the protrusions 17b will now be described with reference to FIGS. 6A and 6B. FIG. 6A shows the structure in which the vibration electrode film 15 has yet to receive an excessively high pressure. FIG. 6B shows the structure in which the vibration electrode film 15 has received an excessively high pressure and deformed greatly. As shown in FIG. 6A, before the vibration electrode film 15 deforms, each protrusion 17b on the back plate 17 passes through and blocks the corresponding pressure relief hole 15b in the vibration electrode film 15. In this state, when pressure is applied to the vibration electrode film 15 from across the back plate 17, the pressure relief hole 15b allows less air to pass, and insufficiently relieves pressure.

However, when an excessively high pressure is applied to the vibration electrode film 15, the pressure greatly deforms the vibration electrode film 15 away from the back plate 17 as shown in FIG. 6B. This causes the protrusion 17b to withdraw from the pressure relief hole 15b (the protrusion to no longer pass through the hole) and uncover the pressure relief hole 15b. The air applying the pressure to the vibration electrode film 15 passes through the pressure relief hole 15b downward in the figures. This instantaneously relieves the pressure applied to the vibration electrode film 15. The pressure relief prevents the vibration electrode film 15 from deforming further after the protrusion 17b withdraws from the pressure relief hole 15b, thus preventing the vibration electrode film 15 from breaking.

Figure 7A:
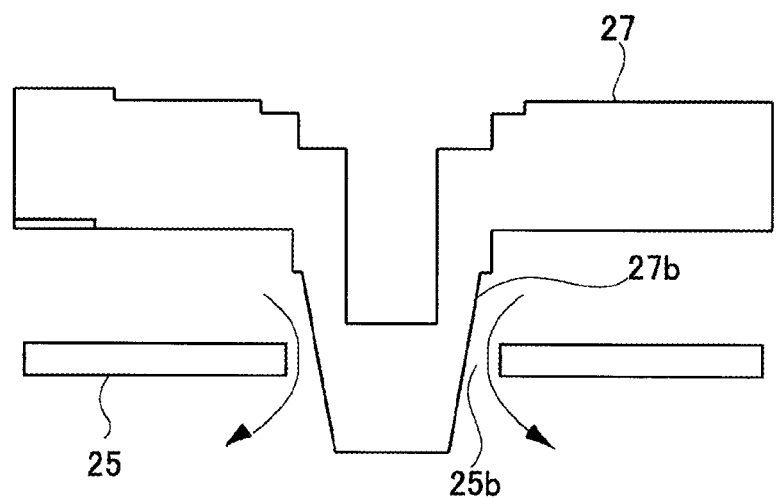
FIGS. 7A and 7B are diagrams describing the functions of a pressure relief hole and a protrusion in the known response to an excessively high pressure abruptly applied to the acoustic sensor.
Figure 7B:
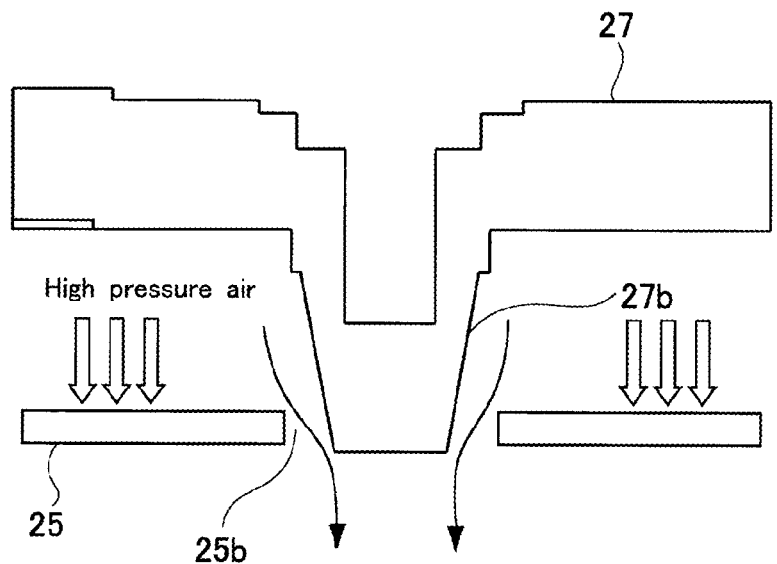

FIGS. 7A and 7B show an example of the above structure including a steplessly and linearly tapered protrusion 27b. In this structure, when a vibration electrode film 25 deforms greatly under an excessively high pressure applied to the vibration electrode film 25, a more distal, small-diameter part of the protrusion 27b passes through a pressure relief hole 25b. This increases the area of air passage for relieving pressure, and prevents the vibration electrode film 25 from deforming excessively.

The known structures described above allow a successful pressure relief when receiving pressure from above (or from across the back plate) to move the vibration electrode film downward. However, when receiving pressure applied from below to move the vibration electrode film upward, the structures cannot increase the area of air passage for pressure relief, and thus cannot prevent the vibration electrode film from deforming excessively upward.

Figure 8A:
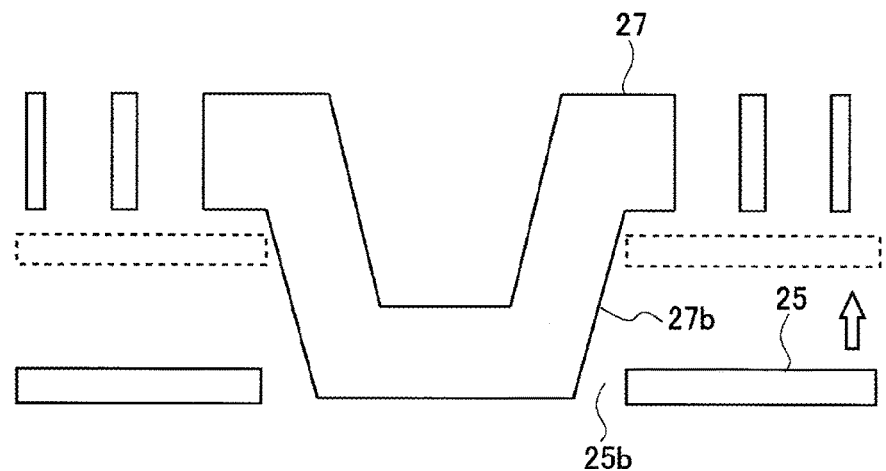
FIGS. 8A and 8B are diagrams describing the functions of a pressure relief hole and a protrusion according to a first embodiment of the present invention.

When, for example, the vibration electrode film 25 moves upward as shown in FIG. 8A in the structure with the steplessly and linearly tapered protrusion 27b, the area of air passage for pressure relief is reduced on the contrary. This structure cannot prevent the vibration electrode film 25 from deforming excessively upward.

Figure 8B:
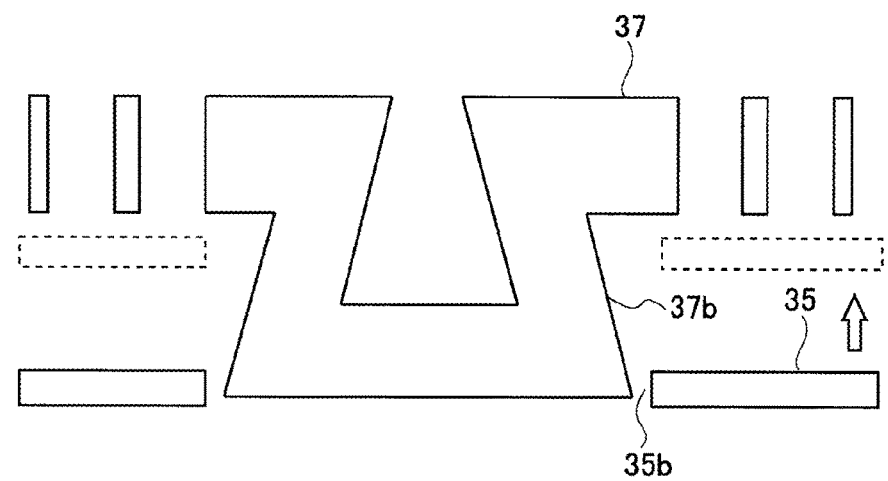

In the present embodiment, the cross-sectional area of a protrusion 37b parallel to a back plate 37 decreases steplessly and linearly toward the base, or the back plate 37, as shown in FIG. 8B. When an excessively high pressure is applied to a vibration electrode film 35 from below to greatly deform the vibration electrode film 35 upward, a smaller cross-section portion of the protrusion 37b adjacent to the base passes through a pressure relief hole 35b. This increases the area of air passage for pressure relief to prevent the vibration electrode film 35 from deforming excessively.

In the present embodiment, when an excessively high pressure is applied to the vibration electrode film 35 from above (or from across the back plate 37) to greatly deform the vibration electrode film 35 downward, a larger cross-section portion of the protrusion 37b adjacent to the distal end passes through the pressure relief hole 35b. This first reduces the area of air passage for pressure relief, but then increases the area of air passage sufficiently for pressure relieve at the position where the protrusion 37b protrudes out of the pressure relief hole 35b in the vibration electrode film 35. The structure according to the present embodiment prevents the vibration electrode film 35 from deforming excessively under an excessively high pressure applied to the vibration electrode film 35 either from above or below.

Figure 9A:
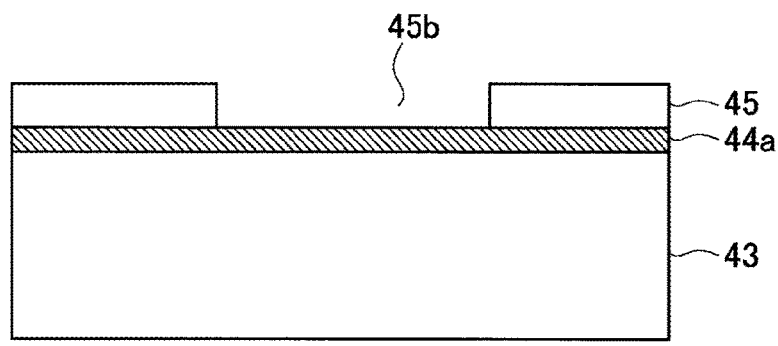
FIGS. 9A to 9C are first diagrams describing the process of forming a pressure relief hole and a protrusion according to the first embodiment of the present invention.

The process of forming a protrusion and a pressure relief hole in the present embodiment will now be described with reference to FIGS. 9A to 10C. As shown in FIG. 9A, a silicon oxide (SiO2) insulator layer 44a is first formed on the surface of a silicon (Si) substrate 43, and a polysilicon (poly-Si) film 45 to be a vibration electrode film is formed on the insulator layer 44a. The poly-Si film 45 to be the vibration electrode film is then partially removed by etching to define a pressure relief hole 45b.

Figure 9B:
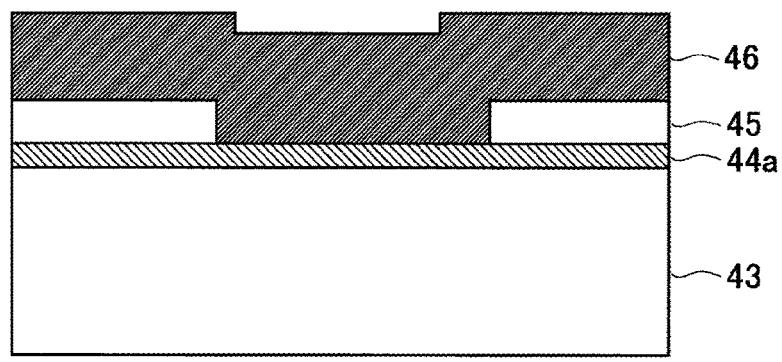
Figure 9C:
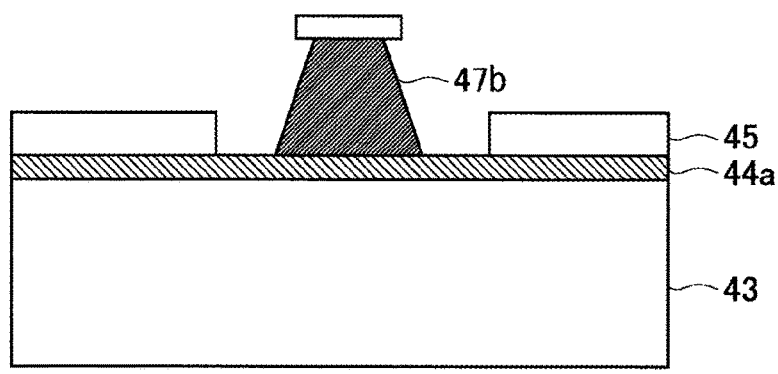

As shown in FIG. 9B, a silicon nitride (SiN) film 46 to form a protrusion is then formed on the poly-Si film 45. As shown in FIG. 9C, the SiN film 46 is partially removed by etching with a photoresist to leave a part to be a protrusion 47b. The vertical directivity of the etching may be reduced to provide a tapered shape.

Figure 10A:
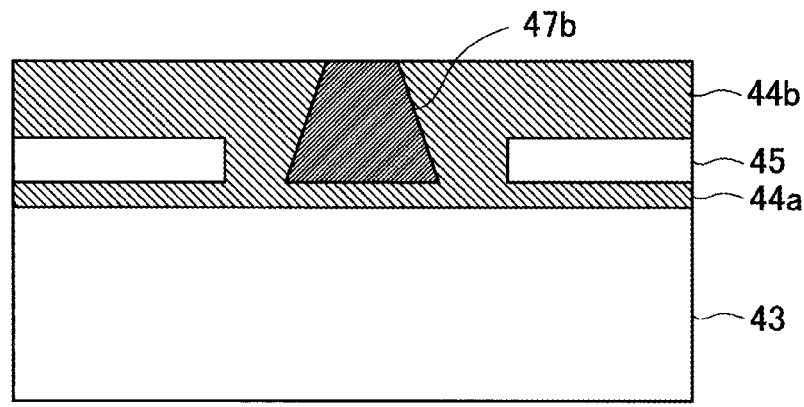
FIGS. 10A to 10C are second diagrams describing the process of forming the pressure relief hole and the protrusion according to the first embodiment of the present invention.
Figure 10B:
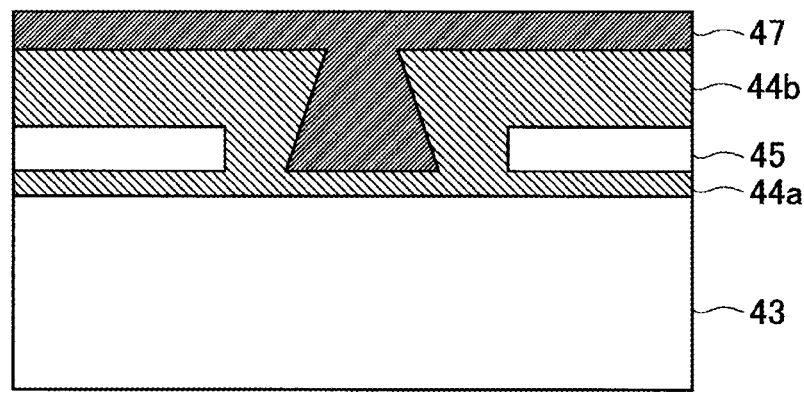

As shown in FIG. 10A, a SiO2 sacrificial layer 44b is then formed. The protrusion 47b of SiN is embedded in SiO2 through smoothing such as chemical-mechanical polishing (CMP). As shown in FIG. 10B, a SiN film to be a back plate 47 including the reverse tapered protrusion 47b is then formed.

Figure 10C:
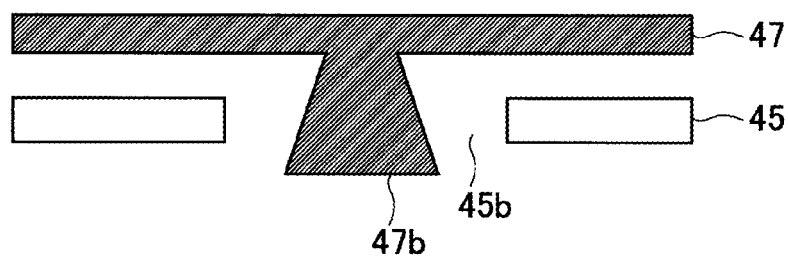

Subsequently, the Si substrate 43 is removed by etching as in the process of fabricating a common acoustic sensor, and the SiO2 insulator layer 44a and the sacrificial layer 44b are removed by etching with hydrogen fluoride (HF) to complete the back plate 47 including the protrusion 47b and the vibration electrode film 45 having the pressure relief hole 45b as shown in FIG. 10C.

Figure 11A:
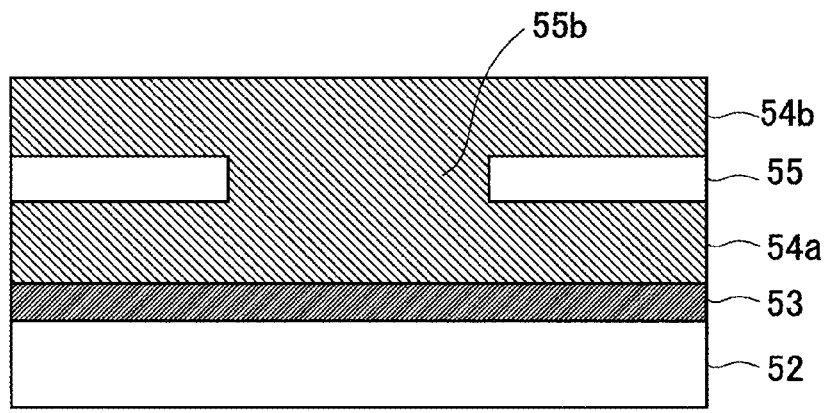
FIGS. 11A to 11C are third diagrams describing the process of forming a pressure relief hole and a protrusion according to the first embodiment of the present invention.

A second example of the process of forming a protrusion and a pressure relief hole in the present embodiment will now be described with reference to FIGS. 11A to 12C. As shown in FIG. 11A, a phospho-silicate glass (PSG) (phosphorus-containing SiO2 film 53) is first formed on the surface of a Si substrate 52, and a non-doped silicate glass (NSG) 54a, which is a SiO2 film free of impurities, is formed on the film 53. A poly-Si film 55 to be a vibration electrode film further formed on the NSG 54a. The film 55 is partially removed by etching to form a pressure relief hole 55b. Additionally, an NSG 54b is formed on this structure.

Figure 11B:
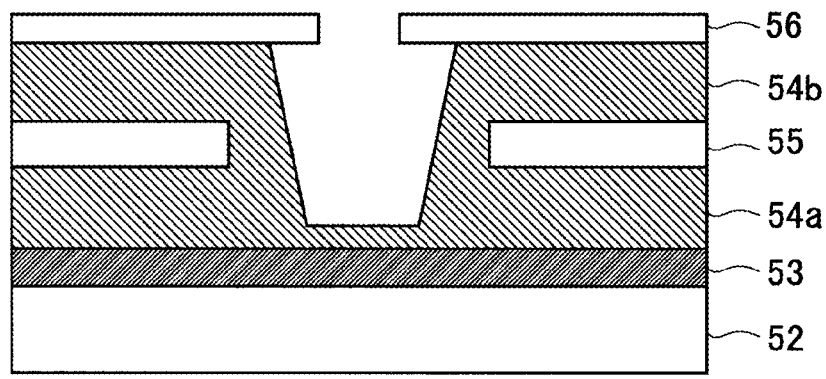
Figure 11C:
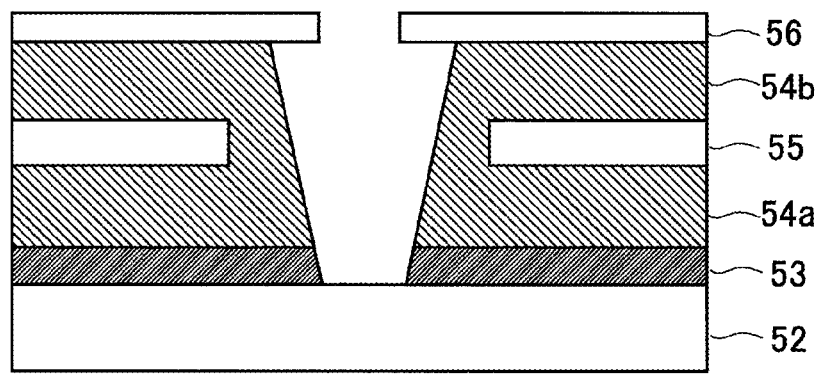

As shown in FIG. 11B, a photoresist having an opening for a protrusion is then formed on the NSG 54a, and a part of the NSGs 54a and 54b corresponding to the protrusion is removed by etching with aqueous HF solution. The etching with the hydrofluoric acid progresses isotropically to remove the PSG 53 to uncover the surface of the Si substrate 52 as shown in FIG. 11C.

Figure 12A:
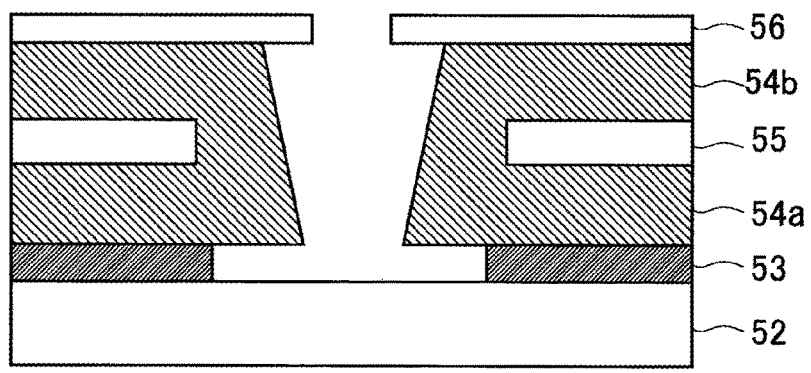
FIGS. 12A to 12C are fourth diagrams describing the process of forming the pressure relief hole and the protrusion according to the first embodiment of the present invention.
Figure 12B:
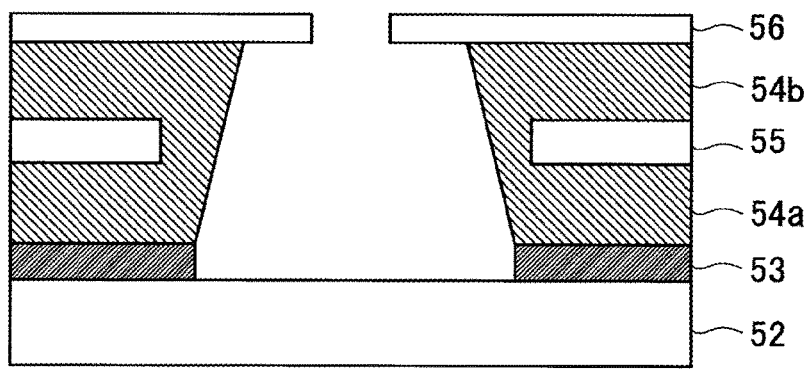

As shown in FIG. 12A, the PSG film 53 has an etching rate several times higher than the NSG films 54a and 54b, and thus the etching progresses faster in the horizontal direction. In the NSG films 54a and 54b, the etching progresses from a lower layer, and thus the NSG films 54a and 54b have a reverse tapered cavity as shown in FIG. 12B, which is reverse to the taper in FIG. 12A.

Figure 12C:
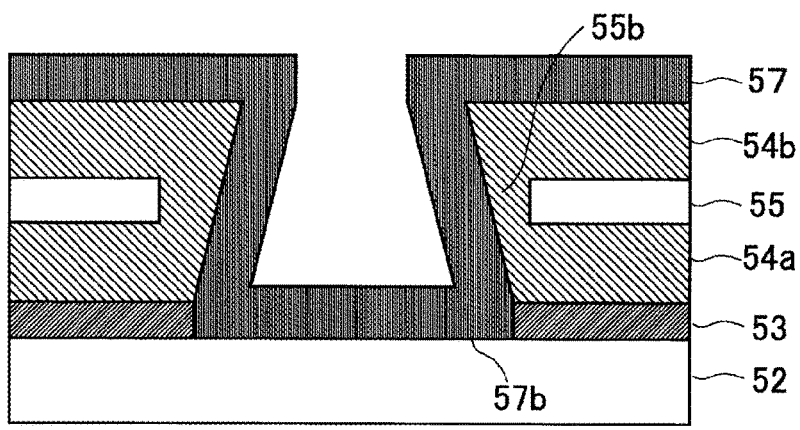

As shown in FIG. 12C, the photoresist is then removed and a SiN film to be a back plate 57 and a protrusion 57b is formed. Thus, the back plate 57 including the reverse tapered protrusion 57b is obtained.

In the present embodiment, the PSG film 53 and the NSG films 54a and 54b are used in the process, but these are mere examples. Any other combination of materials having different etching rates may be used. For example, SiO2 with the etching rate increased by annealing may be combined with unannealed SiO2. In some embodiments, a tetraethylorthosilicate (TEOS) film having a high etching rate may be combined with a thermal oxide film having a low etching rate.

Figure 13A:
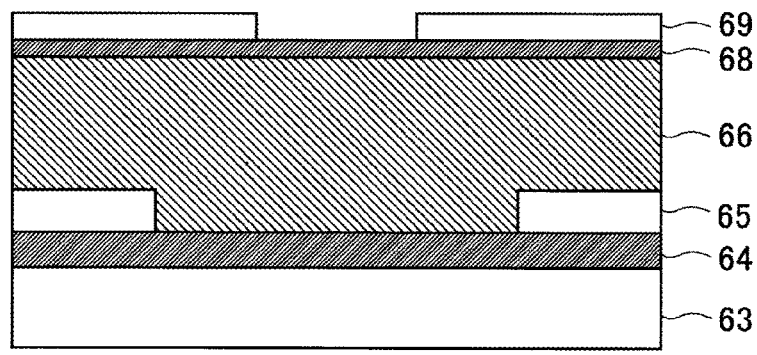
FIGS. 13A to 13C are fifth diagrams describing the process of forming a pressure relief hole and a protrusion according to the first embodiment of the present invention.

A third example of the process of forming a protrusion and a pressure relief hole in the present embodiment will now be described with reference to FIGS. 13A to 13C. As shown in FIG. 13A, a PSG film (phosphorus-containing SiO2 film 64) is first formed on the surface of a Si substrate 63. A poly-Si film 65 to be a vibration electrode film is further formed on the film 64. The film 64 is partially removed by etching to form a pressure relief hole 65b. Additionally, an NSG film 66, which is a SiO2 film free of impurities, is formed on the film 65b. A PSG film (phosphorus-containing SiO2 film 68) is further formed on the NSG film 66, and a photoresist 69 having an opening for a protrusion is formed on the PSG film.

Figure 13B:
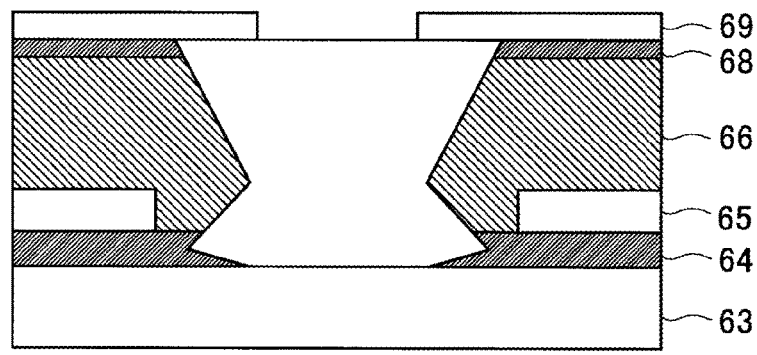

As shown in FIG. 13B, the part corresponding to the protrusion is then removed from the PSG films (phosphorus-containing SiO2 films 64 and 68) and the NSG film 66 by etching with an aqueous HF solution. In this etching, the difference in the etching rates between the layers allows the slope to be modified variously. The etching with the aqueous HF solution also removes the PSG film 64 to uncover the surface of the Si substrate 63.

Figure 13C:
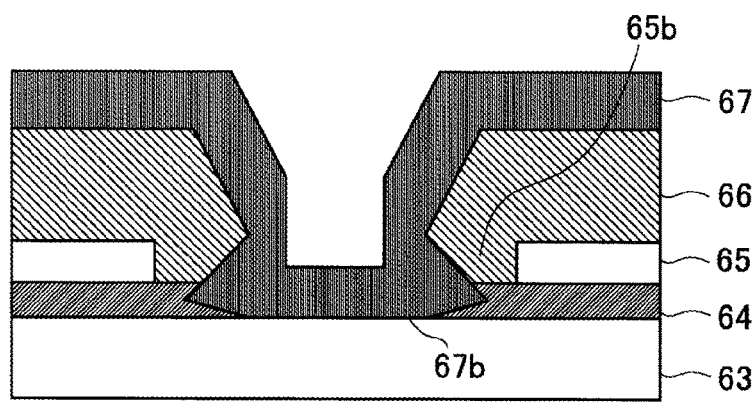

As shown in FIG. 13C, the photoresist is then removed before a silicon nitride (SiN) film to be a back plate 67 and a protrusion 67b is placed to form the back plate 67 including the reverse tapered protrusion 67b.

The PSG film 68, which is the uppermost layer in the present embodiment, may be eliminated. The surface on which the photoresist 69 is placed can typically have a locally higher etching rate. With this tendency of the etching rate, the similar shape as in the above embodiment can be formed without the PSG film 68.

The protrusion 67b in the present embodiment has its part adjacent to the back plate 67 with a horizontal cross-sectional area at least smaller than the average corresponds to a predetermined position of the present invention. The protrusion 67b has its part with a horizontal cross-sectional area at least smaller than the average corresponds to a smaller cross-section portion.

Second Embodiment

A second embodiment of the present invention will now be described. In the present embodiment, a sound hole is formed in a substantially columnar protrusion integral with a back plate. The sound hole includes the side surface of the protrusion in the horizontal direction, and extends in the protrusion halfway in the vertical direction. This sound hole increases the area of the pressure relief channel adjacent to the base of the protrusion.

Figure 14:
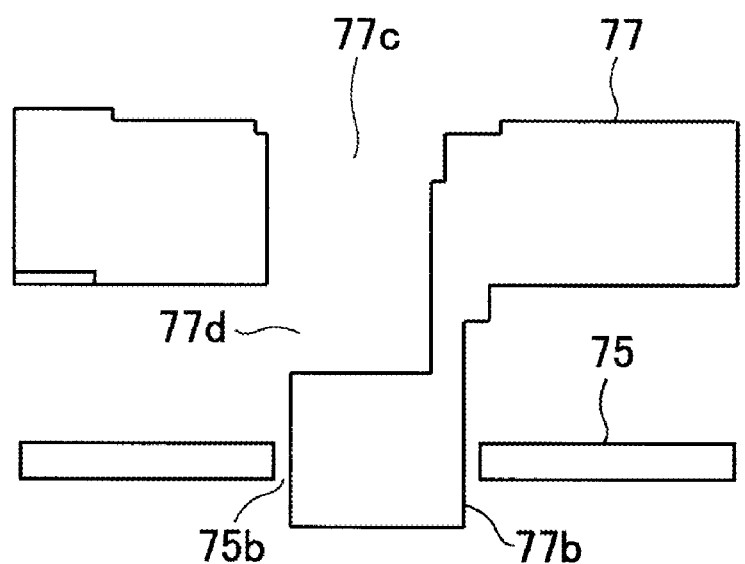
FIG. 14 is a cross-sectional view showing a protrusion formed on a back plate and a pressure relief hole formed in a vibration electrode film according to a second embodiment.

FIG. 14 is a cross-sectional view showing a protrusion 77b formed on a back plate 77 and a pressure relief hole 75b formed in a vibration electrode film 75 according to the present embodiment. The protrusion 77b in the present embodiment, which is substantially columnar, is formed with the sound hole in the back plate 77 by etching. More specifically, a cavity 77c is formed to include the side surface of the columnar protrusion 77b in the horizontal direction and extend in the columnar protrusion 77b halfway in the vertical direction, while leaving a distal end portion of the protrusion 77b.

The cavity 77c and the adjacent side surface of the protrusion 77b define an opening 77d. The opening 77d is formed on the side surface of the protrusion 77b and is adjacent to the back plate 77. In the state shown in FIG. 14, under an excessively high pressure applied to the vibration electrode film 75 from its side opposite to the back plate 77 (from the bottom of the drawing), the vibration electrode film 75 deforms toward the back plate 77 (toward the top in the figure). When the vibration electrode film 75 further deforms toward the back plate 77 beyond the lower end of the opening 77d, the air applying the pressure to the vibration electrode film 75 enters the opening 77d, passes through the cavity 77c, and escapes from the top of the back plate 77. This escaping air relieves the pressure applied to the vibration electrode film 75 from its side opposite to the back plate 77.

In this manner, the cavity 77c can be formed to include the side surface of the protrusion 77b as viewed from above in the process of forming a sound hole in the back plate 77 having the protrusion 77b. This easily reduces the cross-sectional area of a part of the protrusion 77b adjacent to the back plate 77. The part of the protrusion 77b in the height direction formed as the cavity 77c corresponds to a predetermined position of the present invention. The part of the protrusion 77b formed as the cavity 77c corresponds to a smaller cross-section portion.

Third Embodiment

A third embodiment of the present invention will now be described. In the present embodiment, a tapered protrusion that decreases its diameter from a back plate toward the distal end has an opening in a part of the side surface adjacent to the back plate, and a cavity extending through the opening and the top of the back plate.

Figure 15A:
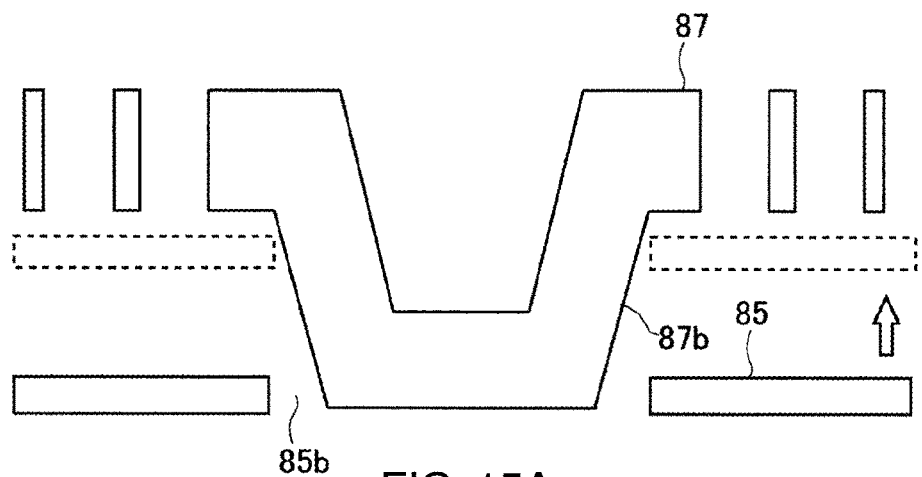
FIGS. 15A and 15B are cross-sectional views showing a protrusion formed on a back plate and a pressure relief hole formed in a vibration electrode film according to a third embodiment.
Figure 15B:
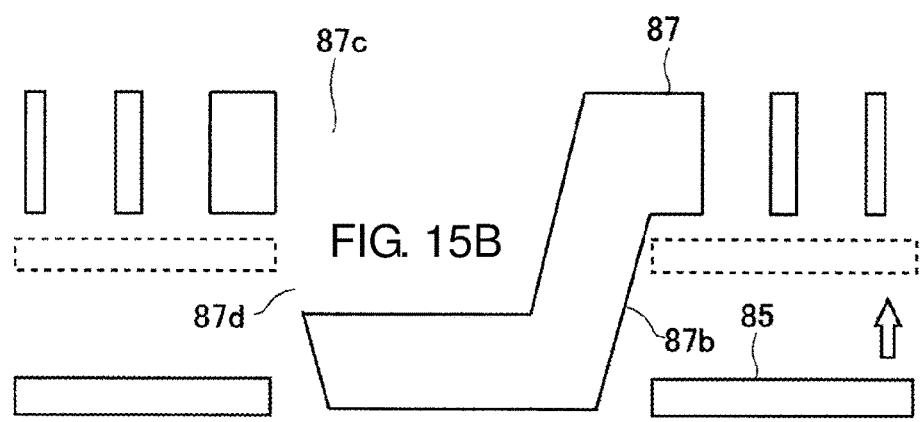

FIGS. 15A and 15B show the function of a known tapered protrusion that decreases its diameter from a back plate toward the distal end, and the function of such a protrusion having an opening in a part of the side surface adjacent to the back plate and a cavity extending through the opening and the top of the back plate.

FIG. 15A shows a typical tapered protrusion. FIG. 15B shows a tapered protrusion having such an opening and a cavity extending through the opening and the top of the back plate. In the structure having a typical tapered protrusion 87b as shown in FIG. 15A, a vibration electrode film 85 deforms toward the back plate 87 under an excessively high pressure applied to the vibration electrode film 85 from its side opposite to a back plate 87. As the vibration electrode film 85 deforms more toward the back plate 87, the area of the gap between the protrusion 87b and a pressure relief hole 85b decreases, causing difficulties in relieving the pressure.

In contrast, as shown in FIG. 15B, the tapered protrusion having an opening 87d in a part adjacent to the back plate 87, and a cavity 87c extending through the opening 87d and the top of the back plate 87 shows a different behavior. Under an excessively high pressure applied to the vibration electrode film 85 from its side opposite to the back plate 87, the vibration electrode film 85 deforms toward the back plate 87. However, when the vibration electrode film 85 reaches the position corresponding to the opening 87d, the air applying the pressure to the vibration electrode film 85 escapes from the top of the back plate 87 through the opening 87d and the cavity 87c.

Thus, the pressure applied to the vibration electrode film 85 can be relieved at this position. The pressure relief prevents the vibration electrode film 85 from deforming further. In the present embodiment, any foreign matter contained in the air applying the pressure to the vibration electrode film 85 from its side opposite to the back plate 87 can be removed through the opening 87d and the cavity 87c, preventing foreign matter from being stuck or accumulating between or near the protrusion 87b and the pressure relief hole 85b.

Figure 16:
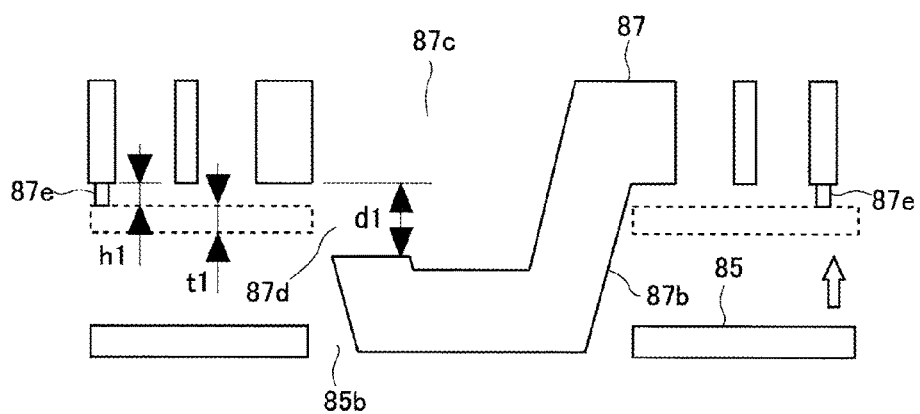
FIG. 16 is a cross-sectional view showing the protrusion formed on the back plate and the pressure relief hole formed in the vibration electrode film according to the third embodiment, for describing the function of a stopper formed on the back plate.

The structure in the present embodiment may include a stopper 87e on the back plate 87 as shown in FIG. 16. The stopper 87e typically prevents adhesion between the back plate 87 and the vibration electrode film 85, or prevents short circuiting due to contact between them. In the present embodiment, the condition below is satisfied:

$$d1 > h1 + t1 \quad (1)$$

where h1 is the height of the stopper 87e, d1 is the depth of the opening 87d from the back plate 87, and t1 is the thickness of the vibration electrode film 85.

Although the vibration electrode film 85 toward the back plate 87 under an excessively high pressure applied to the vibration electrode film 85 from its side opposite to the back plate 87, the vibration electrode film 85 comes into contact with the stopper 87e on the back plate 87 and then stabilizes. In this state, a part of the opening 87d reliably communicates with the side of the vibration electrode film 85 opposite to the back plate 87. Thus, when an excessively high pressure is applied to the vibration electrode film 85 from its side opposite to the back plate 87, the air may escape from the top of the back plate 87 through the opening 87d and the cavity 87c in a more reliable manner to relieve the pressure applied to the vibration electrode film 85. Although the lower end of the opening 87d is flush with the bottom of the inner wall of the protrusion 87b in FIG. 15, the lower end of the opening 87d may not be flush with the bottom of the inner wall of the protrusion 87b. As shown in FIG. 16, they may be different levels.

Although the stopper 87e extends from the back plate 87 in the present embodiment, a protrusion functioning as a stopper may extend from the vibration electrode film 85. This protrusion may be formed as a part of the vibration electrode film 85 or adding another member on the top of the vibration electrode film 85. The protrusion may prevent adhesion to the back plate 87 in the same manner as the stopper 87e. With the height h1 of the stopper, the depth d1 of the opening from back plate, and the thickness t1 of the vibration electrode film satisfying condition (1), the present embodiment produces its advantages.

Fourth Embodiment

A fourth embodiment of the present invention will now be described. In the present embodiment, a vibration electrode film has a slit pressure relief hole, and a back plate has a flat protrusion, instead of a columnar or tapered protrusion. The flat protrusion can be placed through the pressure relief hole.

Figure 17:
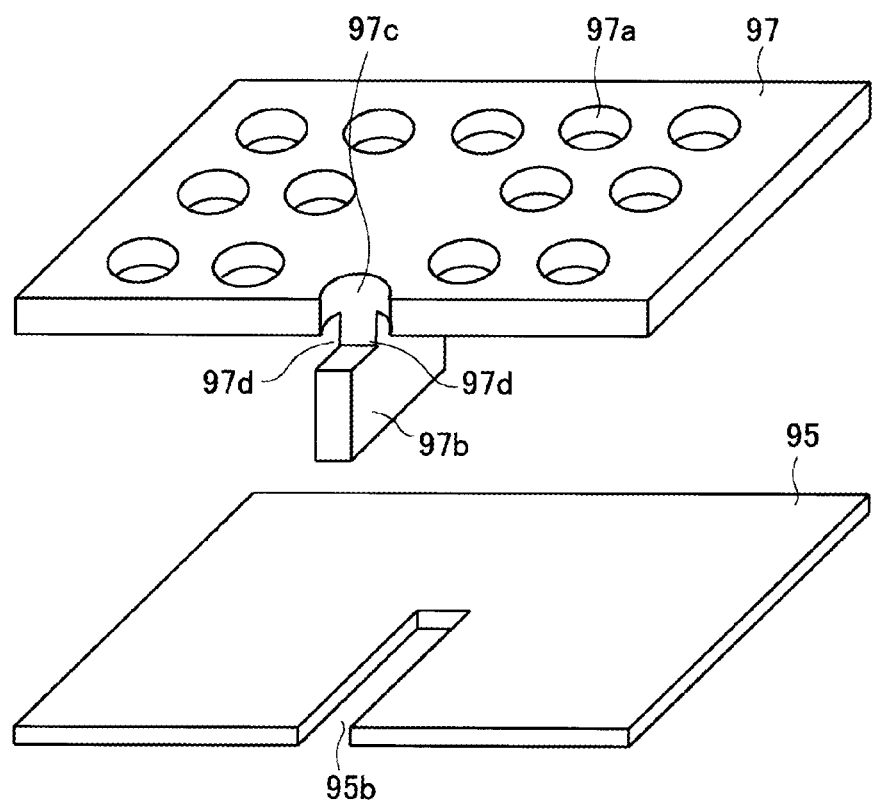
FIG. 17 is a cross-sectional perspective view showing a protrusion formed on a back plate and a pressure relief hole formed in a vibration electrode film according to a fourth embodiment.

FIG. 17 is a cross-sectional perspective view of a back plate 97, a protrusion 97b, a vibration electrode film 95, and a pressure relief hole 95b according to the present embodiment. As described in the above embodiment, the pressure relief hole 95b is not circular but is a slit as viewed from above. The protrusion 97b is flat and can be inserted into the slit pressure relief hole 95b. In FIG. 17, the vibration electrode film 95 and the back plate 97 are sectioned along the middle of the slit pressure relief hole 95b and the flat protrusion 97b. The slit pressure relief hole 95b and the flat protrusion 97b, which are narrow, allow the back plate 97 to be easily flat in semiconductor manufacturing processes. The flat back plate 97 has lower stress concentration. For example, the slit with a width not more than twice the distance between the vibration electrode film 95 and the back plate 97 allows the back plate 97 to be easily flat.

In the present embodiment, the process of forming a sound hole 97a in the back plate 97 also involves forming a cavity 97c extending in the flat protrusion 97b halfway in the height direction. An opening 97d formed in this manner is continuous to the right and left sides of the flat protrusion 97b. In the present embodiment, the sound hole 97a and the cavity 97c may be desirably circular as viewed from above. This structure prevents stress concentration on parts of the back plate 97, particularly near the flat protrusion 97b.

Figure 18A:
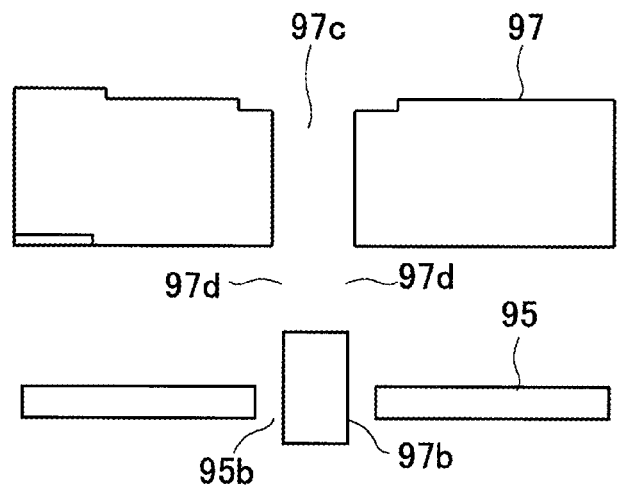
FIGS. 18A and 18B are diagrams describing the functions of the protrusion on the back plate and the pressure relief hole in the vibration electrode film according to the fourth embodiment.
Figure 18B:
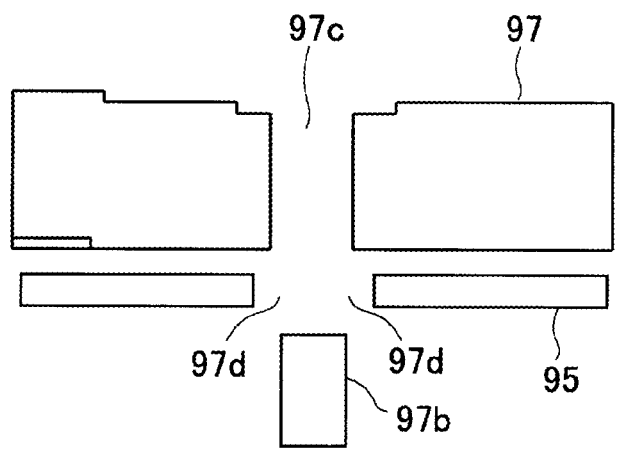

FIGS. 18A and 18B are diagrams describing the functions of the back plate 97 and the vibration electrode film 95 according to the present embodiment. FIGS. 18A and 18B are cross-sectional views of the back plate 97 and the vibration electrode film 95 in FIG. 17 as viewed in the direction of the normal to the sections. In FIG. 18A, the vibration electrode film 95 is not deformed. In FIG. 18B, the vibration electrode film 95 has been deformed toward the back plate 97 under an excessively high pressure applied to the vibration electrode film 95 from its side opposite to the back plate 97.

In the present embodiment, the vibration electrode film 95 deforms toward the back plate 97 under an excessively high pressure applied to the vibration electrode film 95 from its side opposite to the back plate 97. In this state, the air applying the pressure to the vibration electrode film 95 can enter the opening 97d continuous to the right and left sides of the flat protrusion 97b, pass through the cavity 97c, and escape toward the top of the back plate 97. This relieves the pressure applied to the vibration electrode film 95 to prevent the vibration electrode film 95 from deforming excessively.

In the present embodiment, when the vibration electrode film 95 greatly deforms away from the back plate 97 under an excessively high pressure applied from across the back plate 97, the flat protrusion 97b withdraws from the slit pressure relief hole 95b in the vibration electrode film 95 to enable air to pass through the entire pressure relief hole 95b. Thus, the area of air passage is large enough to relieve the pressure applied to the vibration electrode film 95. The structure according to the present embodiment thus prevents the vibration electrode film from deforming excessively 95 under an excessively high pressure applied to the vibration electrode film 95 from either above or below.

Figure 19A:
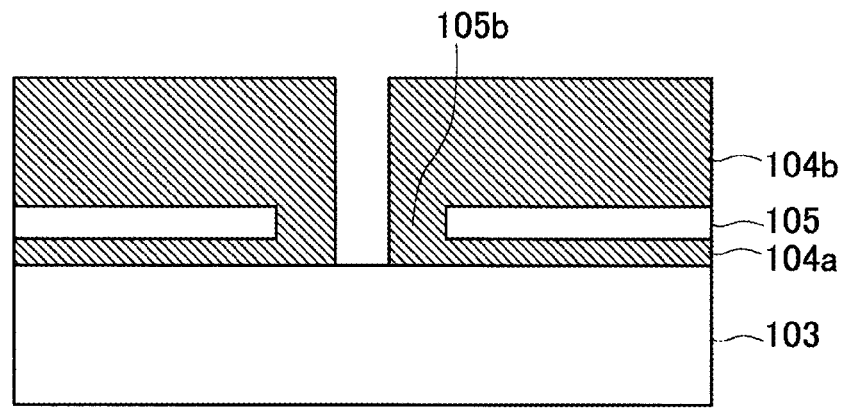
FIGS. 19A to 19C are diagrams describing the process of forming a protrusion on a back plate and a pressure relief hole in a vibration electrode film according to the fourth embodiment.

The process of forming a protrusion and a pressure relief hole in the present embodiment will now be described with reference to FIGS. 19A to 19C. As shown in FIG. 19A, a SiO2 insulator layer 104a is first formed on the surface of a Si substrate 103, and a poly-Si film 105 to be a vibration electrode film is formed on the insulator layer 104a. The poly-Si film 105 is then partially removed by etching to define a pressure relief hole 105b. Additionally, a SiO2 sacrificial layer 104b is formed on the poly-Si film 105, and a slit area to be the protrusion is removed by etching from the insulator layer 104a and the sacrificial layer 104b.

Figure 19B:
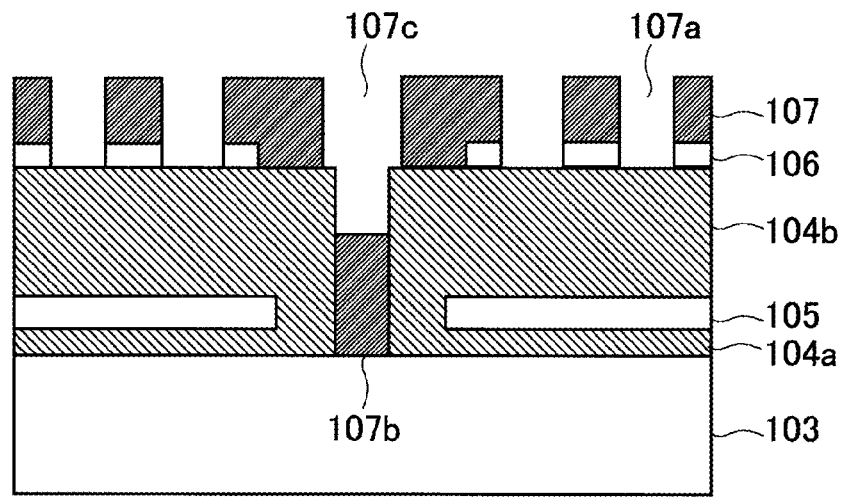
Figure 19C:
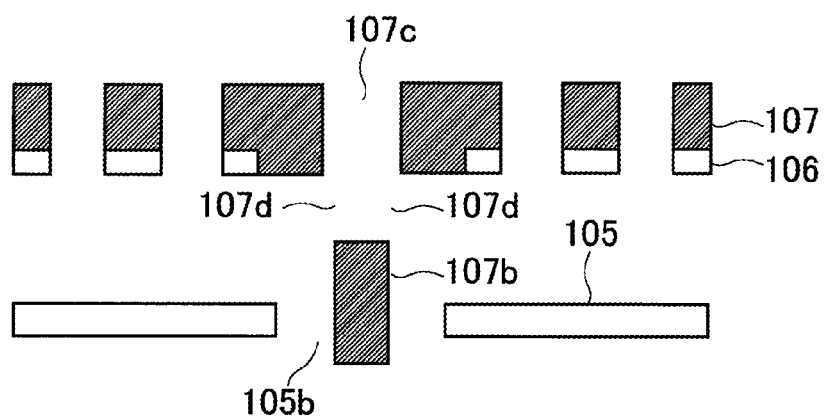

As shown in FIG. 19B, a poly-Si film 106 to be a fixed electrode film is then formed. Additionally, SiN films 107 and 107b to be a back plate and the protrusion are formed. The slit in the S102 insulator layer 104a and the SiO2 sacrificial layer 104b, in which the SiN film 107b to be the protrusion is formed, has a narrow width. Thus, when the back plate 107 is formed, the slit is filled with the SiN film, and the protrusion 107b finally becomes flat. Then, sound holes 107a and a cavity 107c above the protrusion 107b are formed by etching. As shown in FIG. 19C, the Si substrate 103, the insulator layer 104a, and the sacrificial layer 104b are then removed by etching, leaving the portions to be the back plate 107 and the protrusion 107b, and the vibration electrode film 105. As a result, the protrusion 107b on the back plate 107 and the pressure relief hole 105b in the vibration electrode film 105 are obtained.

Figure 20:
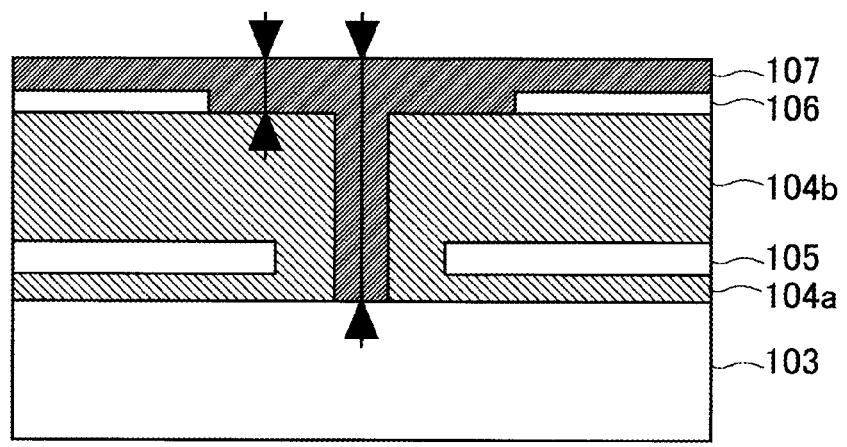
FIG. 20 is a second diagram describing the process of forming the protrusion on the back plate and the pressure relief hole in the vibration electrode film according to the fourth embodiment.

In the present embodiment, as shown in FIG. 20, the portion to be the flat protrusion 107b is thick in the vertical direction. When the sound holes 107a and the cavity 107c above the protrusion 107b are simultaneously formed by etching with high vertical directivity, such as dry etching, the film is left only at the distal end of the protrusion 107b. This allows easy fabrication of the structure with a cavity formed in the protrusion 107b adjacent to the back plate 107. This method of fabrication is optional. The sound holes 107a and the space 107c above the protrusion 107b may also be etched separately. The side surface of the protrusion 107b may be upright or tapered (sloped). The portion to be the flat protrusion 107b having an upright side surface is thick in the vertical direction, and thus allows easy etching.

REFERENCE SIGNS LIST 1 acoustic sensor
2 back chamber
3, 13, 43, 52, 63 (silicon) substrate
5, 15, 25, 35, 45, 55, 65, 75, 85, 95, 105 vibration electrode film
7, 17, 27, 37, 47, 57, 67, 77, 87, 97, 107 back plate
15b, 25b, 35b, 45b, 55b, 65b, 75b, 85b, 95b, 105b pressure relief hole
17b, 27b, 37b, 47b, 57b, 67b, 77b, 87b, 97b, 107b protrusion

The invention claimed is:

1. A capacitive transducer comprising:
a substrate having an opening in a surface thereof;
a back plate facing the opening in the substrate;
a vibration electrode film facing the back plate across a space, the vibration electrode film being deformable to have a deformation converted into a change in capacitance between the vibration electrode film and the back plate, the vibration electrode film having a throughhole as a pressure relief hole; and
a protrusion integral with and formed from the same member as the back plate, the protrusion being placeable in the pressure relief hole before the vibration electrode film deforms,
wherein the protrusion and the pressure relief hole have a gap therebetween defining an airflow channel as a pressure relief channel,
wherein the protrusion includes, at a predetermined position adjacent to the back plate, a smaller cross-section portion having a smaller cross-sectional area in a direction parallel to the back plate than a portion of the protrusion more distal from the predetermined position, and
wherein the protrusion has a cavity extending through a surface thereof opposite to the back plate and a side surface thereof at the predetermined position.

2. The capacitive transducer according to claim 1, wherein the protrusion is flat and has a side surface perpendicular to the back plate.

3. The capacitive transducer according to claim 2, wherein at least one of the back plate and the vibration electrode film includes a stopper configured to come into contact with another of the back plate and the vibration electrode film when the vibration electrode film is displaced toward the back plate, and
wherein the cavity in the protrusion has a depth perpendicular to the back plate being greater than a total of a height of the stopper and a thickness of the vibration electrode film.

4. The capacitive transducer according to claim 2, wherein the cavity is circular as viewed in a direction perpendicular to the back plate.

5. An acoustic sensor comprising:
the capacitive transducer according to claim 2,
wherein the acoustic sensor is configured to convert a sound pressure into a change in capacitance between the vibration electrode film and the back plate, and detect the sound pressure.

6. The capacitive transducer according to claim 1, wherein at least one of the back plate and the vibration electrode film includes a stopper configured to come into contact with another of the back plate and the vibration electrode film when the vibration electrode film is displaced toward the back plate, and wherein the cavity in the protrusion has a depth perpendicular to the back plate being greater than a total of a height of the stopper and a thickness of the vibration electrode film.

7. The capacitive transducer according to claim 6, wherein the cavity is circular as viewed in a direction perpendicular to the back plate.

8. An acoustic sensor comprising:
the capacitive transducer according to claim 6,
wherein the acoustic sensor is configured to convert a sound pressure into a change in capacitance between the vibration electrode film and the back plate, and detect the sound pressure.

9. The capacitive transducer according to claim 1,
wherein the cavity is circular as viewed in a direction perpendicular to the back plate.

10. An acoustic sensor comprising:
the capacitive transducer according to claim 9,
wherein the acoustic sensor is configured to convert a sound pressure into a change in capacitance between the vibration electrode film and the back plate, and detect the sound pressure.

11. An acoustic sensor comprising:
the capacitive transducer according to claim 1,
wherein the acoustic sensor is configured to convert a sound pressure into a change in capacitance between the vibration electrode film and the back plate, and detect the sound pressure.

12. The capacitive transducer according to claim 1,
wherein the protrusion is tapered to have a cross-sectional area decreasing toward the back plate.

13. An acoustic sensor comprising:
the capacitive transducer according to claim 12,
wherein the acoustic sensor is configured to convert a sound pressure into a change in capacitance between the vibration electrode film and the back plate, and detect the sound pressure.

14. A capacitive transducer comprising:
a substrate having an opening in a surface thereof;
a back plate facing the opening in the substrate;
a vibration electrode film facing the back plate across a space, the vibration electrode film being deformable to have a deformation converted into a change in capacitance between the vibration electrode film and the back plate, the vibration electrode film having a through-hole as a pressure relief hole; and
a protrusion integral with and formed from the same member as the back plate, the protrusion being placeable in the pressure relief hole before the vibration electrode film deforms,
wherein the protrusion and the pressure relief hole have a gap therebetween defining an airflow channel as a pressure relief channel,
wherein the protrusion includes, at a predetermined position adjacent to the back plate, a smaller cross-section portion having a smaller cross-sectional area in a direction parallel to the back plate than a portion of the protrusion more distal from the predetermined position,
wherein the protrusion is tapered to have a cross-sectional area decreasing toward the back plate, and wherein the protrusion has a cavity extending through a surface thereof opposite to the back plate and a side surface thereof at the predetermined position.

15. The capacitive transducer according to claim 14,
wherein the protrusion is flat and has a side surface perpendicular to the back plate.

16. The capacitive transducer according to claim 15,
wherein at least one of the back plate and the vibration electrode film includes a stopper configured to come into contact with another of the back plate and the vibration electrode film when the vibration electrode film is displaced toward the back plate, and
wherein the cavity in the protrusion has a depth perpendicular to the back plate being greater than a total of a height of the stopper and a thickness of the vibration electrode film.

17. The capacitive transducer according to claim 15,
wherein the cavity is circular as viewed in a direction perpendicular to the back plate.

18. An acoustic sensor comprising:
the capacitive transducer according to claim 15,
wherein the acoustic sensor is configured to convert a sound pressure into a change in capacitance between the vibration electrode film and the back plate, and detect the sound pressure.

19. The capacitive transducer according to claim 14,
wherein at least one of the back plate and the vibration electrode film includes a stopper configured to come into contact with another of the back plate and the vibration electrode film when the vibration electrode film is displaced toward the back plate, and
wherein the cavity in the protrusion has a depth perpendicular to the back plate being greater than a total of a height of the stopper and a thickness of the vibration electrode film.

20. The capacitive transducer according to claim 19,
wherein the cavity is circular as viewed in a direction perpendicular to the back plate.

21. An acoustic sensor comprising:
the capacitive transducer according to claim 19,
wherein the acoustic sensor is configured to convert a sound pressure into a change in capacitance between the vibration electrode film and the back plate, and detect the sound pressure.

22. The capacitive transducer according to claim 14,
wherein the cavity is circular as viewed in a direction perpendicular to the back plate.

23. An acoustic sensor comprising:
the capacitive transducer according to claim 22,
wherein the acoustic sensor is configured to convert a sound pressure into a change in capacitance between the vibration electrode film and the back plate, and detect the sound pressure.

24. An acoustic sensor comprising:
the capacitive transducer according to claim 14,
wherein the acoustic sensor is configured to convert a sound pressure into a change in capacitance between the vibration electrode film and the back plate, and detect the sound pressure.

* * * * *